(12) United States Patent
Goodwin et al.

(10) Patent No.: US 6,616,469 B2
(45) Date of Patent: Sep. 9, 2003

(54) ELECTRICAL AND FLUID INTERCONNECT

(75) Inventors: Jonathan Goodwin, Braintree, MA (US); Donald P. Amaral, Jr., Seekonk, MA (US)

(73) Assignee: Tyco Electronics Logistics AG, Steinich/SG (CH)

( * ) Notice: Subject to any disclaimer, the term of this patent is extended or adjusted under 35 U.S.C. 154(b) by 0 days.

(21) Appl. No.: 10/094,152

(22) Filed: Mar. 8, 2002

(65) Prior Publication Data

US 2002/0127900 A1 Sep. 12, 2002

Related U.S. Application Data

(60) Provisional application No. 60/275,024, filed on Mar. 12, 2001.

(51) Int. Cl.[7] .............................. H01R 4/60; H05K 7/20
(52) U.S. Cl. ........................ 439/196; 361/699; 439/485
(58) Field of Search ................................ 439/196, 485, 439/519; 361/699, 698, 689; 165/86.4, 80.4, 104.33; 62/259.2

(56) References Cited

U.S. PATENT DOCUMENTS

| | | | |
|---|---|---|---|
| 5,323,847 A | * 6/1994 | Koizumi et al. | 165/104.33 |
| 5,406,807 A | * 4/1995 | Ashiwake et al. | 361/699 |
| 5,815,377 A | 9/1998 | Lund et al. | 361/802 |
| 6,104,613 A | 8/2000 | Urda et al. | 361/704 |
| 6,115,258 A | 9/2000 | Hoyle, Jr. et al. | 361/752 |
| 6,128,196 A | 10/2000 | Hoyle, Jr. et al. | 361/752 |
| 6,175,508 B1 | 1/2001 | McMillian et al. | 361/796 |
| 6,243,273 B1 | 6/2001 | Beun et al. | 361/796 |

* cited by examiner

*Primary Examiner*—P. Austin Bradley
*Assistant Examiner*—Briggitte R. Hammond
(74) *Attorney, Agent, or Firm*—Weingarten, Schurgin, Gagnebin & Lebovici LLP

(57) ABSTRACT

The present invention provides an electrical and fluid interconnect for providing electrical connection between one or more circuits or electrical devices and a mateable circuit board or substrate, and for providing fluid coupling of a cooling fluid to permit fluid flow in relation to the electrical circuits or devices when mated to the circuit board or substrate. The fluid connector has a valve which in the absence of mating pressure is in a closed or off position. When mated to a fluid connector which is part of or coupled to the latch assembly, the valve is opened to permit fluid to flow.

5 Claims, 5 Drawing Sheets

ELECTRICAL AND FLUID INTERCONNECT

CROSS REFERENCE TO RELATED APPLICATIONS

This application claims priority of U.S. Provisional Application No. 60/275,024 filed on Mar. 12, 2001. The disclosure of which is hereby incorporated by reference herein.

STATEMENT REGARDING FEDERALLY SPONSORED RESEARCH OR DEVELOPMENT

N/A

BACKGROUND OF THE INVENTION

Thermal management is an important aspect of the design and fabrication of electronic assemblies. The difficulties of dissipating heat generated by electronic assemblies increase with the increased density of heat generating circuits on circuit boards and other electronic assemblies. Various techniques have been employed for cooling circuit boards and other electronic assemblies. One well known technique is to employ passive heat sinks on integrated circuits and other heat generating components. Fans or blowers are often employed within a cabinet or other enclosure containing electronic devices. It is also known to employ heat sinks or mountings which include one or more channels or passages for the flow of a cooling fluid in order to dissipate heat from the heat generating elements.

BRIEF SUMMARY OF THE INVENTION

In brief, the present invention provides an electrical and fluid interconnect for providing electrical connection between one or more circuits or electrical devices and a mateable circuit board or substrate, and for providing fluid coupling of a cooling fluid to permit fluid flow in relation to the electrical circuits or devices when mated to the circuit board or substrate. The interconnection apparatus is especially useful to mount and connect circuit boards to a backplane or other mateable circuit or device. Fluid connectors on a substrate, which can be a circuit board or other mounting element, are valved and cooperate with mating fluid connector portions or actuators which are part of or which are coupled to a latch assembly. The latch assembly is operative to maintain a circuit board or electrical or electronic device on a circuit board or other mounting. When a circuit or device is installed on the circuit board or other mounting and retained thereon, the fluid connectors are mated and the associated valve is opened to permit cooling fluid flow. When a circuit or device is removed from its mounting by unlatching of the latch assembly, the fluid connector valve is closed to discontinue fluid flow. By virtue of the invention, when a circuit or device is plugged into a circuit board or other mounting, the cooling fluid path is established at the same time and by the same installation step of seating the circuit or device for operation.

In one embodiment one or more circuit cards, each containing one or more circuits or devices, are mounted in a card cage or enclosure and are connected at one end to a backplane. Each card is latched into position within the enclosure by hand operated latch levers. To provide cooling of the circuits, cooling fluid is allowed to circulate through mounting plates or heat sinks which retain the circuits in position on the respective cards. A fluid manifold is provided which is in fluid communication with one or more valved fluid connectors. Each fluid connector mates with a connector mounted on the latching assembly. Fluid tubing connects the fluid connector to fluid channels in the circuit mounts. The fluid connector has a valve which in the absence of mating pressure is in a closed or off position. When mated to a fluid connector which is part of the latch assembly, the valve is opened to permit fluid to flow. The fluid is typically water which is cooled to a suitable temperature to provide requisite cooling. Closing of the latches seats a circuit card in position in the enclosure, causes mating of the electrical contacts of the circuit card with contacts on the backplane, and also causes mating of the fluid connectors and opening of the associated valves to permit cooling fluid to flow through the cooling paths. Release of the latches causes the fluid valves to close and also releases the card from its mounted engagement with the backplane for removal of the card. Thus, the latch assembly is operative to mechanically and electrically mount each circuit card in the enclosure and to also activate the fluid cooling paths.

BRIEF DESCRIPTION OF THE SEVERAL VIEWS OF THE DRAWING

The invention will be more fully described in the following detailed description in conjunction with the drawing, in which.

DETAILED DESCRIPTION OF THE INVENTION

Figure 1:
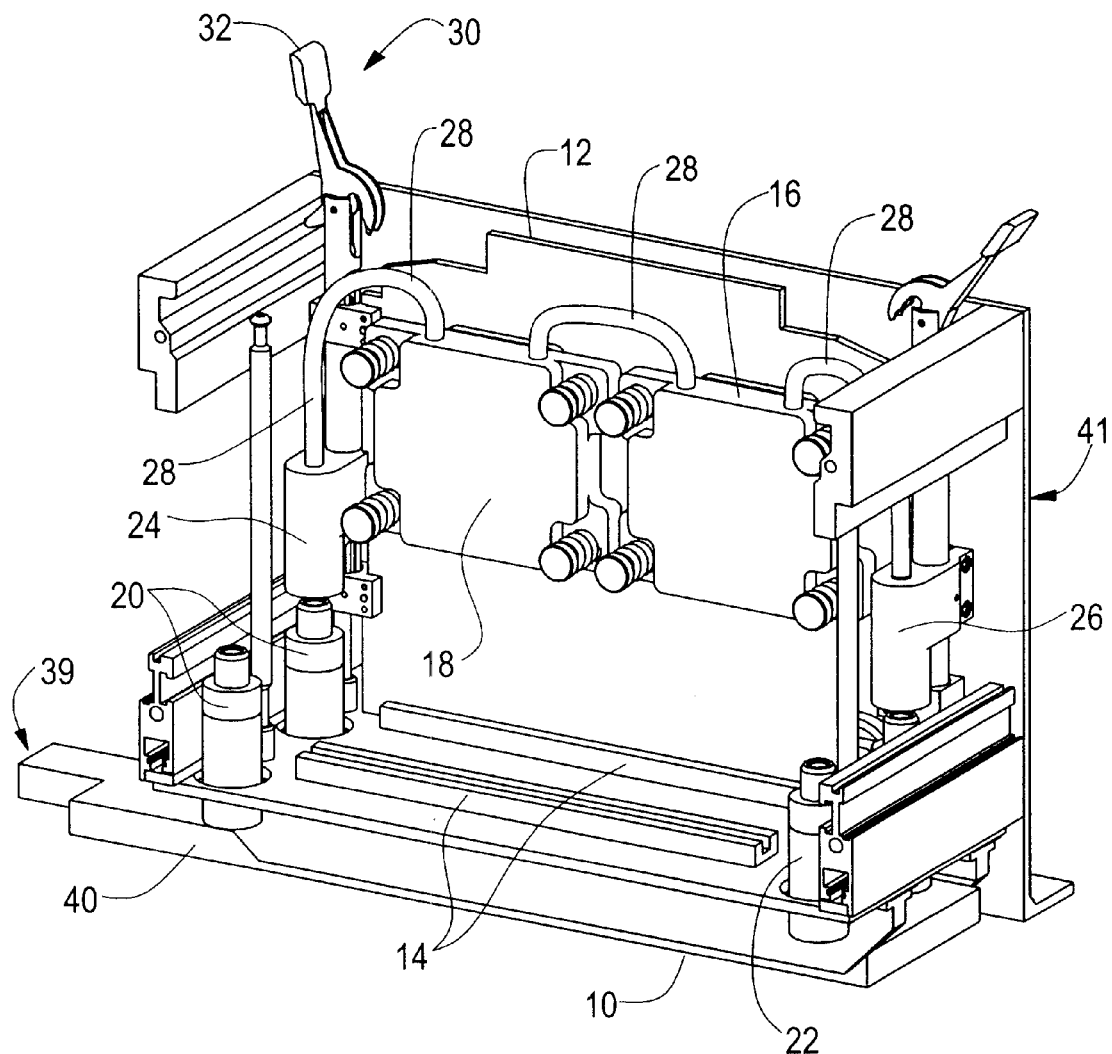
FIG. 1 is a pictorial view of one embodiment of the invention.
Figure 2:
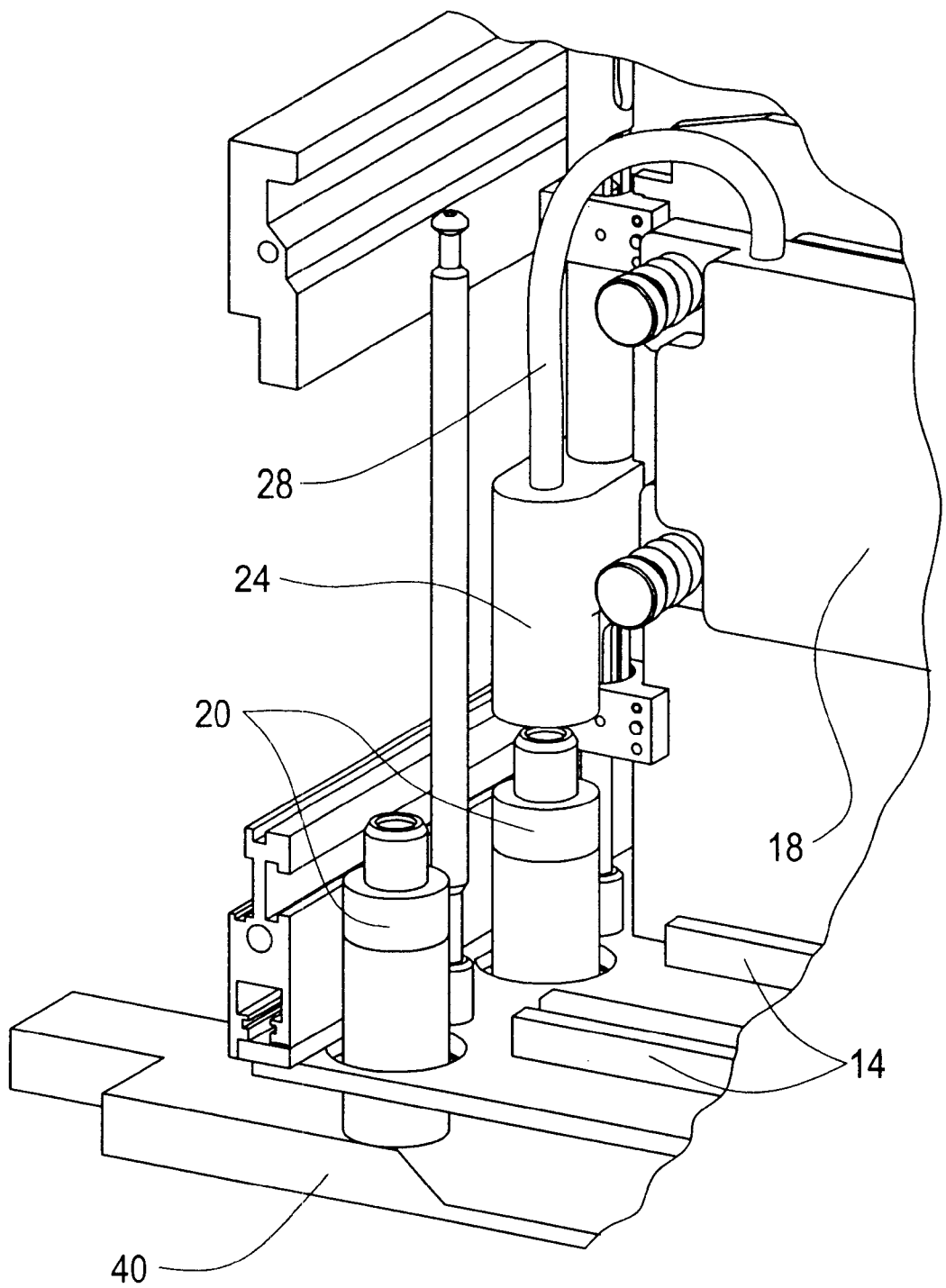
FIG. 2 is a pictorial view illustrating the valved fluid connectors of the embodiment of FIG. 1.
Figure 3:
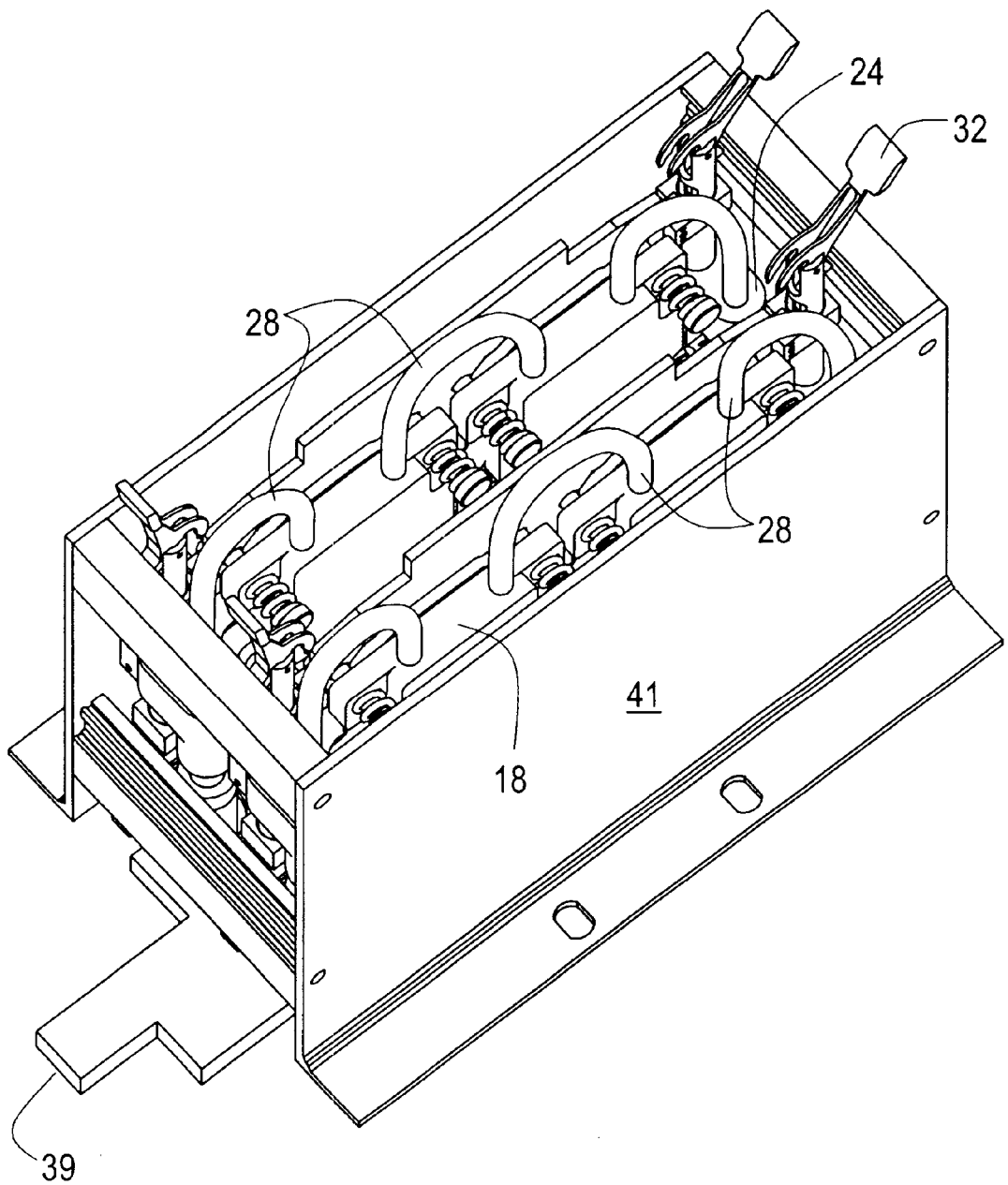
FIG. 3 is another pictorial view illustrating the fluid paths through the circuit mounts.

The invention is illustrated in one embodiment in FIGS. 1–4 in which the fluid and electrical interconnect apparatus is employed in a backplane and circuit card assembly.

Referring to FIGS. 1–4 there is shown a backplane 10 having a circuit board 12 mounted thereon. The circuit board includes an electrical connector 14 by which the circuit board mates with the backplane. A second connector 14 is shown for accepting a second circuit board. One or more integrated circuits or other electrical components 16 are mounted on each circuit board and are retained thereon by circuit mounting plates 18. A manifold 40 beneath the backplane includes a pair of valved fluid connectors 20 and 22 which are mateable with fluid connectors 24 and 26 on each circuit board. Fluid paths are provided through the circuit mounting plates and are in fluid coupling with the connectors 24 and 26 by means of fluid tubing 28. Each circuit board is maintained in seated position on the backplane by a latch assembly 30 which is operative by latch levers 32.

Each inlet connector 20 is mated with a connector 24, and each outlet connector 22 is mated with a connector 26 when the associated circuit board is seated onto the backplane. These connector sections are operative to open a valve in each of connectors 20 and 22 to provide cooling fluid flow when the circuit board is in mounted position. When the circuit board is removed the connectors are unmated and the valves close to discontinue fluid flow. The latching of each circuit board to the backplane provides opening of the cooling fluid pathway, and also provides mechanical seating of the circuit board and electrical connection of the circuit board to the backplane by way of the electrical connectors 14. Upon unlatching of the circuit board, cooling fluid flow is discontinued, and the board is mechanically and electrically unmated from the backplane.

In operation, water or other suitable cooling fluid is directed to the inlet 39 of the manifold 40 and thence through the valved connectors 20 on one end of the assembly and mated connectors 24 to the cooling channels of the mounting plates 18 via tubing 28. After passing through those cooling channels, fluid flows through the tubing to the mated connectors 22 and 26 on the opposite end of the assembly and then out of the manifold. In this manner cooling fluid can be continuously circulated through the circuit mounts to maintain the circuits at a safe operating temperature.

In an alternative embodiment, the cooling channels of the mounting plates 18 can be coupled to the cooling channels of the manifold 40 by alignment of fluid orifices on the manifold and on the mating edge of the mounting plates, without need for interconnecting tubing.

As discussed above, closing of the latches 30 seats the associated circuit card in position in the connector 14 on the backplane to provide electrical mating of the electrical contacts of the circuit card and contacts of the backplane connector, and also causes mating of the fluid connectors and opening of the associated valves to permit cooling fluid to flow through the cooling path.

Upon release of the latches 30, the associated circuit card is unseated from the backplane and the fluid valves are closed to discontinue fluid flow and to permit release of the card from mounted engagement with the backplane. The latch mechanism serves to mechanically, electrically and fluidically mount each circuit card to the backplane.

The backplane is typically mounted within an enclosure 41 or card cage in which each of the circuit cards can be installed. The enclosure or card cage can be of any well known form and usually provides guide channels for alignment of respective circuit cards with contacts on the backplane for providing electrical engagement of the circuit cards and the backplane.

Figure 4:
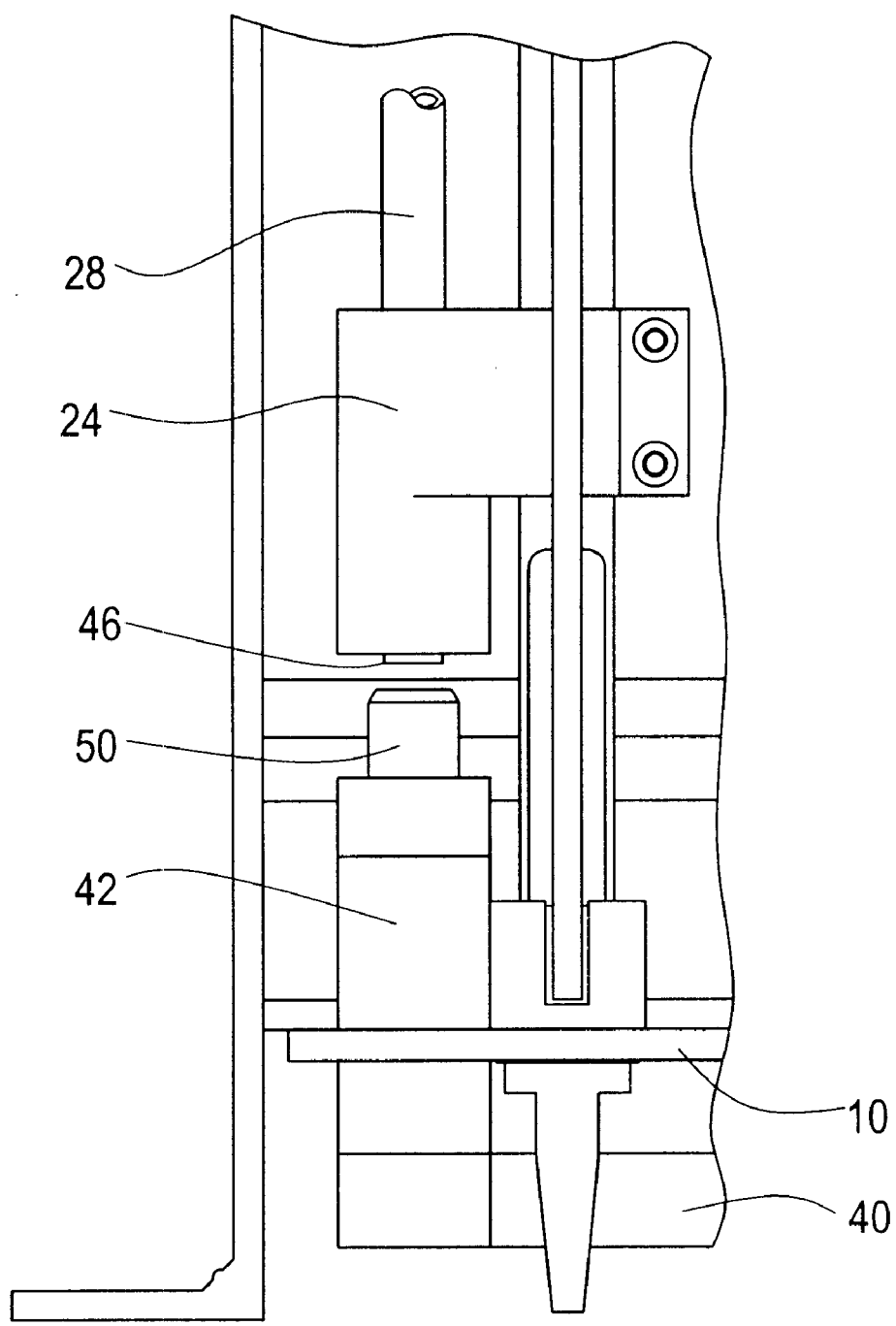
FIG. 4 is an elevation view showing a valved connector.

As shown in FIG. 4 the inlet fluid connector 20 includes a body 42 with a valve mechanism therein and having an upper end portion 50. The body is coupled to the manifold 40 which is disposed below the backplane 10. An inlet connector 20 is provided for each circuit board position of the backplane, and the manifold is in fluid coupling relationship with each of the inlet connectors. The connector body 42 is mounted on the manifold and extends through an opening provided in the backplane. In the absence of a mating connector of a circuit board, the valve is closed and fluid cannot flow out of the connector. In the presence of a mating connector 24 on a circuit board the valve is opened by actuating end 46 depressing a mating portion of end 50 to permit fluid flow through the mated connectors and thence through tubing 28 to the mounting plates of the circuits or devices on the circuit card. It will be recognized that the valve mechanism can be variously implemented and actuated by the seating of the circuit board on the backplane.

In the illustrated embodiment each circuit card includes a valved inlet and outlet connector. In an alternative embodiment, a single valved connector can be employed.

Figure 5:
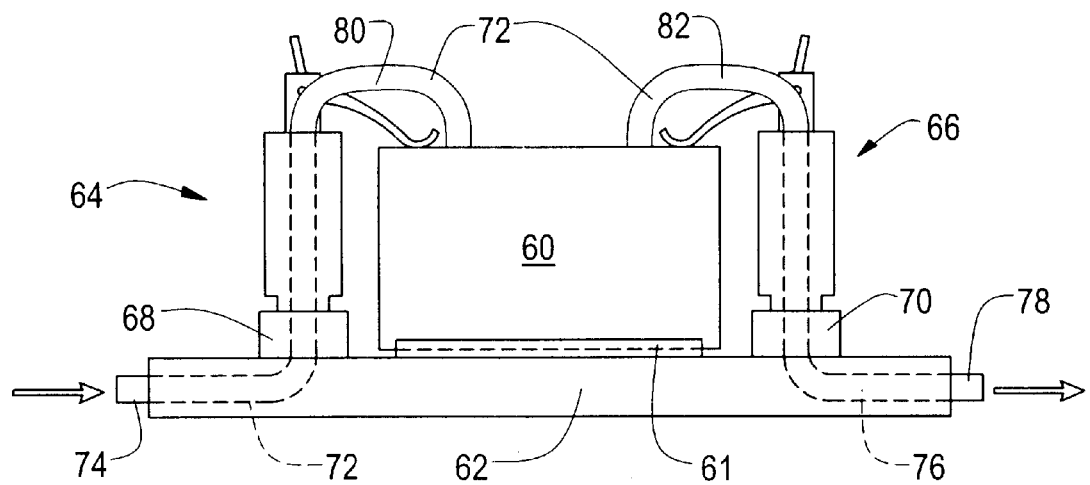
FIG. 5 is a diagrammatic elevation view of a second embodiment of the invention.

Another embodiment is illustrated in FIG. 5 in which an electrical or electronic device 60 is attached to a substrate 62 and retained thereon by first and second latch mechanisms 64 and 66 which are cooperative with valved fluid connectors 68 and 70. The valved connector 68 is coupled via a fluid channel 72 in the substrate to a fluid inlet 74. The valved connector 70 is coupled via a fluid channel 76 in the substrate to a fluid outlet 78. Cooling fluid is caused to flow via the inlet 74 channel 72 and valved connector 68 and tubing 80 through cooling channels in the device 60 or the device mount attached thereto, and thence via tubing 82 through valved connector 70, passage 76 and outlet 78. A continuous cooling fluid path is provided when the device 60 is latched into position by the latch mechanisms 64 and 66. The latch mechanisms are also operative to electrically and mechanically seat the device to mating contacts of a connector 61 on the substrate or a circuit board or mount associated therewith.

To remove the device, the mechanisms 64 and 66 are unlatched which causes closure of the valves of valved connectors 68 and 70 and shutoff of fluid flow. Release of the latch mechanisms also permits electrical disconnection of the device from its electrical mounting.

Figure 6:
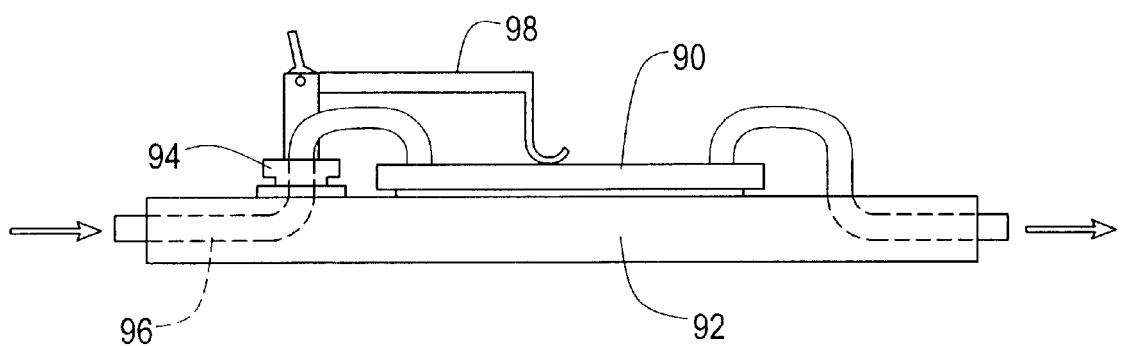
FIG. 6 is a diagrammatic elevation view of yet another embodiment of the invention.

A further embodiment is shown in FIG. 6 in which an electrical device 90 is mounted coplanar to a substrate 92. A fluid valve 94 is provided in the inlet passage 96, the valve being operative by a latch mechanism 98 which is operative to retain the device 90 on the substrate and to seat the device on the mating electrical socket or contacts. This embodiment is operative similarly to that described above wherein latching of the device in operative position provides opening of the fluid valve to permit cooling fluid flow, as well as providing mechanical and electrical connection. Only a single valve is illustrated in the embodiment of FIG. 6. Upon release of the latch mechanism, the valve 94 is caused to close thereby discontinuing cooling fluid flow and permitting removal of the device from its mounting.

The invention is not to be limited by what has been particularly shown and described as variations and alternative implementations may occur to those of skill in the art.

What is claimed is:

1. An interconnect apparatus comprising:
   a substrate having at least one cooling channel for flow of cooling fluid;
   a valved fluid connector for coupling to a source of cooling fluid and in valved fluid coupling relationship with the substrate cooling channel;
   a socket for receiving an electronic device;
   a mounting plate engageable with the electronic device seated in the socket, the mounting plate having at least one cooling channel;
   a fluid passage in fluid communication between the fluid connector and the mounting plate cooling channel; and
   a latch assembly for seating the electronic device in the socket and operative during seating of the device in the socket to open the valve of the fluid connector to allow cooling fluid to flow through the cooling channels of the substrate and the mounting plate.

2. The interconnect apparatus of claim 1 further including:
   a second valved fluid connector in valved fluid coupling relationship with the substrate cooling channel;
   a second fluid passage in fluid communication between the second fluid connector and the mounting plate cooling channel; and
   a second latch assembly operative to maintain the electronic device in seated position in the socket and to open the valve of the second fluid connector to permit flow of cooling fluid.

3. The interconnect apparatus of claim 2 further including a backplane having the socket thereon;

and wherein the electronic device includes a circuit board mountable on the socket.

4. An electrical and fluid interconnect apparatus for providing electrical connection between at least one electrical device and a mateable circuit board and cooling of the at least one electrical device mated to the circuit board, the interconnect apparatus comprising:

a valved fluid connector for coupling to a source of cooling fluid and in fluid coupling with a device mount engageable with the device;

the valve of the fluid connector being closed in the absence of a mated electrical device and open when the device is mated to the circuit board; and a latch assembly connectable to the fluid connector and operative to seat the device on the circuit board in electrical connection therebetween and to open the valve of the fluid connector to allow the flow of cooling fluid through the device mount when the device is mated to the circuit board.

5. An interconnect apparatus for providing electrical connection between at least one electrical device and a mateable mounting, and cooling of the at least one electrical device mated to the mounting, the interconnect apparatus comprising:

a source of cooling fluid;

a fluid connector having a valve for coupling to the source of cooling fluid;

a cooling element engageable with the electrical device when mated to the mounting and in fluid coupling relationship with the valve of the fluid connector; and a latch assembly connectable to the fluid connector and operative to maintain the device on the mounting in electrical connection thereon and to open the valve of the fluid connector to allow the flow of cooling fluid through the cooling element.

* * * * *